United States Patent [19]
Hedberg

[11] Patent Number: 5,568,082
[45] Date of Patent: Oct. 22, 1996

[54] SIGNAL-RECEIVING AND SIGNAL-PROCESSING UNIT

[75] Inventor: Mats O. J. Hedberg, Handen, Sweden

[73] Assignee: Telefonaktiebolaget L M Ericsson, Stockholm, Sweden

[21] Appl. No.: 391,005

[22] Filed: Feb. 21, 1995

[30] Foreign Application Priority Data

Feb. 21, 1994 [SE] Sweden .................................. 9400593

[51] Int. Cl.⁶ .......................... H03K 17/687; H03K 17/60
[52] U.S. Cl. ........................... 327/437; 327/391; 327/432; 327/490; 323/315
[58] Field of Search ...................... 327/51, 52, 53, 327/108, 389, 391, 432, 437, 463, 427, 374, 490; 323/315, 316

[56] References Cited

U.S. PATENT DOCUMENTS

| | | | |
|---|---|---|---|
| 4,366,445 | 12/1982 | Cave et al. | 330/257 |
| 4,673,830 | 6/1987 | Giorgetta et al. | 327/542 |
| 4,749,880 | 6/1988 | Kobatake | 327/63 |
| 4,791,326 | 12/1988 | Vajdic et al. | 327/437 |
| 4,972,107 | 11/1990 | Draxelmayr | 327/53 |
| 4,978,905 | 12/1990 | Hoff et al. | 327/427 |
| 5,028,811 | 7/1991 | Le Roux et al. | 327/427 |
| 5,148,063 | 9/1992 | Hotta | 327/53 |
| 5,166,637 | 11/1992 | Wurcer | 330/257 |
| 5,229,666 | 7/1993 | Sandhu | 327/51 |
| 5,331,233 | 7/1994 | Urakawa | 327/63 |

FOREIGN PATENT DOCUMENTS 3525522   1/1986   Germany .

*Primary Examiner*—Timothy P. Callahan
*Assistant Examiner*—My-Trang Nu Ton
*Attorney, Agent, or Firm*—Burns, Doane, Swecker & Mathis, L.L.P.

[57] ABSTRACT

A signal-receiving and signal-processing unit connected to one or several conductors is configured to transmit information-carrying signals in the form of voltage pulses. The conductor is connected to a transistor in a signal-receiving circuit to affect a current by using variations in the voltage pulses and the voltage value of a pulse. The current is in the form of pulses that pass through the transistor. The current is generated by the voltage pulse variations and voltage level. The current is given a signal-adapted information-carrying form by a signal-processing circuit. The transistor in the signal-receiving circuit is coordinated with at least one other transistor so that together they form a current mirror circuit.

70 Claims, 6 Drawing Sheets

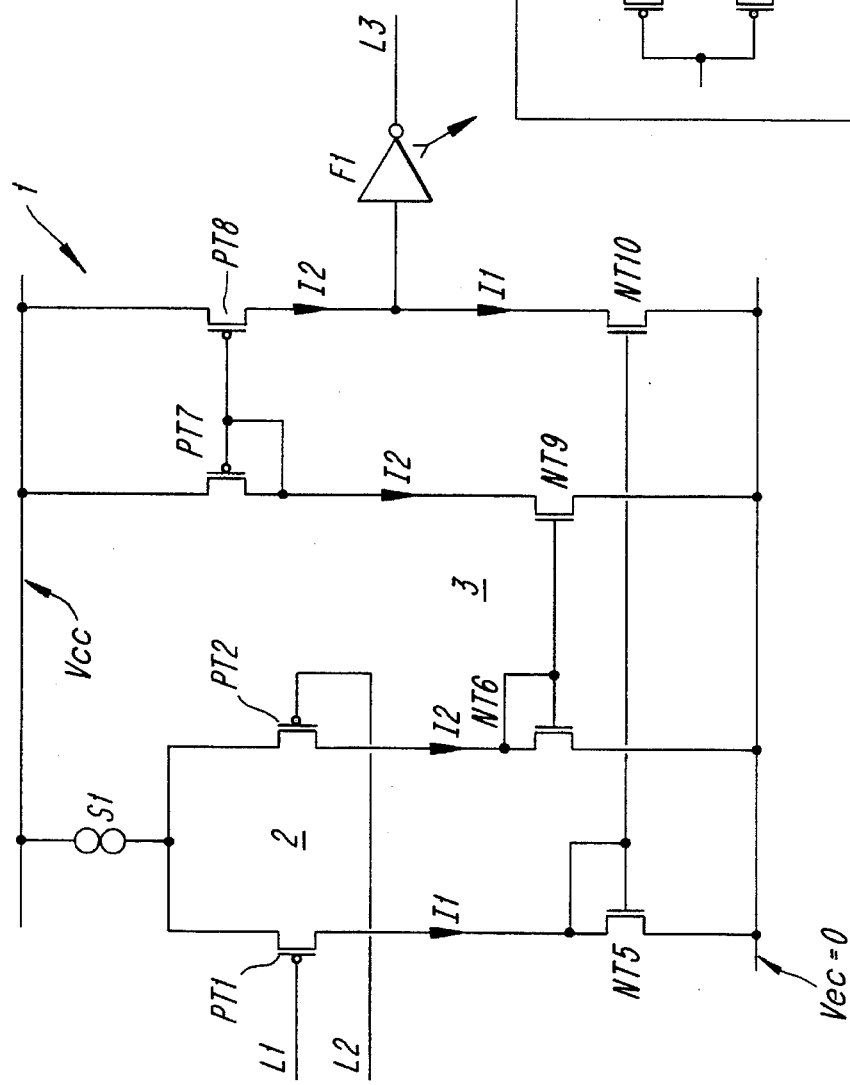
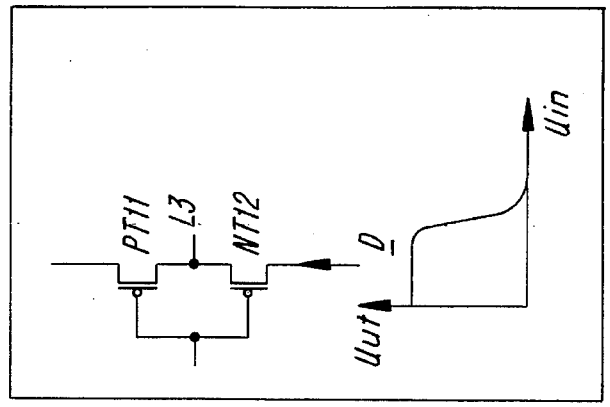
Fig. 3
PRIOR ART
Fig. 3a
PRIOR ART

SIGNAL-RECEIVING AND SIGNAL-PROCESSING UNIT

BACKGROUND

Applicant's invention relates to a signal-receiving and signal-processing unit comprising a signal-receiving circuit and a signal-processing circuit.

The invention relates more specifically to a signal-receiving circuit and a signal-processing circuit for signals that are pulse-shaped voltage variations having a selected repetition frequency on the order of more than one megabit per second (1 Mb/s), preferably more than 100 Mb/s. The voltage variations are controlled to represent a digital-information-carrying signal, with an internal structure, by a transmitting circuit. The digital signal is distorted by, among other things, the signal-transferring conductor, and the receiving circuit is intended to be able to detect and receive a thus distorted digital signal.

Units of this kind are used to adapt received (distorted) signals into transmitted signals of an internal signal structure. The method is based on adapting a received signal, which presents a somewhat erroneous voltage level and/or is not adapted to a certain common mode (CM) area, by the signal-processing unit, to an internal signal structure more suitable to requirements needed in an exchange of signals.

Such signal-receiving and signal-processing units are connected to a conductor adapted to transmit information-carrying signals in the form of voltage pulses. The conductor is connected to a transistor belonging to a signal-receiving circuit to affect a current by using variations in the voltage pulses and the voltage value of a pulse. The current is in the form of pulses that pass through the transistor, and the current is generated by the voltage pulse variations and voltage level. A signal-processing circuit gives the current a signal-adapted information-carrying form that is better adapted to a certain form of circuit-internal information-carrying signals than was the form of the received signal.

Signal-receiving and signal-processing units of this kind have been useful to evaluate the information content in voltage pulses having a pulse rate in the range of up to 200 Mb/s. Signal-receiving and signal-processing units of this kind have been adapted to detect pulse-shaped voltage variations appearing on a single conductor (single-ended signalling), or to detect pulse-shaped voltage variations appearing on or between two conductors (differential signalling).

For simplification, the following description is limited to only differential signalling, but the invention provides for signal-receiving and signal-processing units for both signalling systems. A person skilled in the art will recognize the measures needed to keep the voltage potential of one conductor at a constant level, which is required for single ended signalling. This will, nevertheless, be described below.

It is further known to use various techniques to manufacture these signal-receiving and signal-processing units to thereby achieve various working conditions for the units. It is known to use both CMOS technology and bipolar technology to manufacture signal-receiving units and signal-processing units of the kind described above. For simplicity, the following description will mainly describe the use of CMOS technology. The differences in function obtained using bipolar technology are of minor significance and would be apparent to a person skilled in the art. Also, the changes required to adapt the CMOS technology and/or the bipolar technology to other known technologies would be apparent to a person skilled in the art.

On manufacturing units of this kind, two criteria, among other things, are significant: (1) the CM area of the signal-receiving circuit and the signal-processing circuit (in a differential signalling system, the CM area is the voltage range within which the received voltage pulses must be for detection by the signal-receiving circuit); and (2) the limiting value of the repetition frequency of the individual voltage variations on the conductors that can be detected and distinguished by the signal-receiving circuit and thereafter processed by the signal-processing circuit.

It is known to connect each of the information-carrying signals that appear on the conductors to a respective gate terminal, the gate terminals belonging to respective PMOS transistors. The CM area would then be the voltage range from somewhat more than half of the supply voltage (Vcc) down to zero potential (see FIG. 3). The use of a PMOS transistor and a post-connected current mirror circuit, such as a post-connected cascode circuit or the like (described below), provides a CM area that is extended downwards to somewhat less than zero potential (approximately −0.7 volt).

It is also known that PMOS transistors provide a lower limiting value of the repetition frequency (up to 200 Mb/s) than provided by an NMOS transistor.

One can also notice that changing the PMOS transistors to NMOS transistors (see FIGS. 3 and 4) would provide a CM area extending from the supply voltage down to somewhat less than half the supply voltage. This is not acceptable since, in a practical application, the CM area has to be at least within the area provided by PMOS transistors and a post-connected current mirror, e.g., a cascode circuit.

It can further be mentioned that when constructing signal-receiving and signal-processing units of this kind it is known to use and coordinate two transistors in the signal-processing circuit (FIG. 3) so that a current through a first one of the transistors is mirrored to be the same as a current through the other transistor. Conditions are thus created that permit the drain-source voltage of the second transistor to vary relatively greatly in relation to the current variation through the first transistor. Such a signal-processing current mirror circuit is described in more detail below with reference to FIG. 1.

To complete this description of known art and to mention a circuit that in some cases can be suitable for the present invention, it should be mentioned that the current through the second transistor can be made independent of the drain-source voltage by using a cascode circuit (a high impedance current generator). Such a cascode circuit, having four transistors, is described in more detail below with reference to FIG. 2.

Other current mirror circuits are also known, such as circuits that use three transistors like the Wilson current mirror. The expression "current mirror circuit" will in the following description and claims be understood to cover every kind of current mirror, regardless of whether two, three, or more transistors are used. The Wilson current mirror and the cascode circuit are current mirror circuits that provide better attributes when connected as current generators.

The publication, "CMOS analog circuit design" by P. E. Allen (ISBN 0-03-006587-9), and German patent document no. DE 35 25 522 provide further and more detailed understanding of the known art.

CMOS technology uses PMOS transistors and NMOS transistors, and in the following every selected transistor will be described with an "N" or a "P" before the respective reference numeral to indicate whether the transistor is an NMOS or PMOS transistor. The following description only mentions NMOS transistors, but that expression is intended to include also bipolar NPN transistors and equivalent transistors of other technologies. Similarly, bipolar PNP transistors and the like will be understood to be included in the expression "PMOS transistors".

Considering the known art as described above and trends in this technical field, it is a technical problem to provide a signal-receiving unit that can at least present a CM area corresponding to that which can be achieved with PMOS transistors, with post-connected current mirror circuits, according to the embodiment in FIG. 4, and that can increase the repetition frequency towards the limit available with fast transistors such as NMOS transistors, bipolar NPN transistors or the like.

It is a technical problem to provide a specific connection of the NMOS transistors in the signal-receiving circuit so that a CM area is provided that comprises voltage variations even below the zero level.

It is also a technical problem to realize the advantages that are achieved by connecting pair-wise related NMOS transistors in the signal-receiving circuit as a current mirror circuit.

It is a further technical problem to realize the advantages that come from letting at least two of the pair-wise connected NMOS transistors be connected together to at least one of the conductors where the voltage pulses appear by their source terminals (or their drain terminals).

It is a technical problem to realize that at a connection of the above-described NMOS transistors the two connected NMOS transistors are connected to each other and to a reference potential by their gate terminals.

It is also a technical problem to compensate, with simple means, time deviations depending on the difference that can appear with transmission systems where a current value, belonging to one of the conductors, is to be mirrored a selected number of times (e.g., n) in the signal-processing circuit, while another current value belonging to the other conductor is to be mirrored another selected number of times (e.g., n+1) before these two current values are to activate an inverter and/or an amplifier or the like.

It is a further technical problem to create a signal-processing unit from NMOS transistors that not only provides a large CM area, from somewhat below zero-level (say, −0.7 volt) up to somewhat more then half the selected supply voltage, for the received signals carrying information as voltage pulses, but that also converts a received voltage pulse into a desired internal signal structure, such as an adaptation to CMOS signals or emitter-coupled-logic (ECL) signals.

It is also a technical problem to create a signal-receiving unit able to detect signals carrying information in the form of voltage pulses with a very high bit rate, in the gigabit per second (Gb/s) range, by at least letting the signal-receiving circuit contain NMOS transistors forming a specific circuit.

It is also a technical problem to realize the importance of letting such NMOS transistors be connected to a first conductor and letting two or several other NMOS transistors be connected to a second conductor to simultaneously be able to receive voltage pulses (voltage values) that are appear on the conductors and convert these to corresponding current values.

It is also a technical problem to realize the importance of letting two pair-wise related NMOS transistors be connected to one and the same conductor and thereby realize that the conductor is to be connected directly to the source or drain terminals of the transistors, if CMOS technology is used, or to the emitter terminals of the transistors, if bipolar technology is used.

It is also a technical problem to realize the importance of letting two NMOS transistors, or bipolar transistors, be mutually connected to a conductor and further to be connected with a number of post-connected current mirror circuits.

It is also a technical problem to realize the importance of a selected number of pair-wise related transistors, for both of the two conductors, being coordinated into current mirror circuits.

It is also a technical problem to use the connections of the pair-wise transistors, one pair from each of the respective two conductors, so that these serve as double floating current mirror circuits.

It is further a technical problem to realize the importance of letting the pair-wise related NMOS transistors be mutually supplied with a current by a cascode circuit or the like.

It is further a technical problem to realize the importance of letting the transistor or transistors be post-connected by pair-wise related current mirror circuits belonging to the signal-processing circuit.

It is further a technical problem to realize the importance of letting a unit belonging to the signal-processing unit that is adapted to evaluate current differences be post-connected by an inverter to generate an output signal.

It should also be regarded as a technical problem to realize the importance of letting one or several current mirror circuits be cascode-connected or the like.

SUMMARY

With the intention of solving one or more of these technical problems, the problems being general for signalling systems of "single-ended" type and "differential" type and/or if CMOS technology or bipolar technology or the like is used, Applicant's invention provides a signal-receiving and signal-processing unit adapted to a signalling system of single-ended type that with simple means can be converted into differential type or vice versa. The unit is connected to one or several conductors adapted to transmit information-carrying signals as voltage pulses. Each conductor is connected to a transistor in a signal-receiving circuit for affecting a current according to variations in the voltage pulses and the voltage value of a pulse. The current is in the form of pulses that pass through the transistor, and the current is generated by the voltage pulse variations and voltage level. The current is given a signal-adapted information-carrying form.

According to one aspect of the invention, the transistor in such a signal-receiving and signal-processing unit is an NMOS transistor, a bipolar NPN transistor, or an equivalent transistor that is connected to receive voltage pulses appearing on a conductor. The transistor is connected to another NMOS transistor, bipolar NPN transistor, or equivalent transistor so that together they form a current mirror circuit with one or several current mirror functions or the like.

In a preferred embodiment, the two or several NMOS transistors, or the like, are connected to the conductor by their source or drain terminals. Also, the two or several connected NMOS transistors, or the like, are connected to each other and to a reference potential by their gate terminals (base terminals, if bipolar transistors). Also, the two of several NMOS transistors, or the like, are supplied with a current by current mirror circuits and/or cascode circuits or the like.

A first current driven through two or several of the NMOS transistors, or the like, is transferred through a number of current mirror circuits and mirrored a selected number of times (n), and a second current is transferred through a number of current mirror circuits and mirrored another selected number of times (n+1). The difference between the selected numbers or mirror circuits may be as small as possible, practically unity.

The difference between the momentary values of the two currents is connected to a signal amplifier that comprises an NMOS transistor and a PMOS transistor connected to each other in series. The two transistors have different characteristics, which are selected so that the transistors compensate time deviations due to the difference in the selected number of current mirror circuits.

Also according to the invention, one NMOS transistor may be connected to a first conductor and another NMOS transistor may be connected to a second conductor, or two or more NMOS transistors may be connected in parallel to one and the same conductor. Further, two or several pairs of NMOS transistors, each pair coordinated into a current mirror circuit, may be connected to the first and/or the second conductor. If NMOS transistors are used, the source terminals or drain terminals of the NMOS transistors may be connected to the conductor since NMOS transistors are quite symmetrical in this regard.

According to Applicant's invention, two NMOS transistors are connected to a conductor and coordinated into a current mirror circuit. Also, each pair of transistors for each of the two conductors is coordinated into a current mirror circuit.

When two conductors adapted to differential information-carrying signals are used, and at a synchronous evaluation of the voltage pulses appearing thereon, the current difference received by the signal-processing circuit can be fed out as a pulsed output signal. The pairs of coordinated transistors associated with the two conductors serve as double floating current mirror circuits. Further, one pair of the coordinated NMOS transistors may be supplied with current, not only by a current mirror circuit, but also by a cascode circuit or the like.

Both NMOS transistors within the signal-receiving circuit are post-connected, one with an even number and one with an odd number, with current mirror circuits in the signal-processing circuit. A unit in the signal-processing unit that is adapted to evaluate current differences is post-connected by an inverter to generate a voltage-related output signal.

According to Applicant's invention, the current mirror circuits that are preconnected to the transistors can be cascode circuits or the like.

The advantages of Applicant's signal-receiving and signal-processing unit connected to one or several conductors adapted to transmit information-carrying signals in the form of voltage pulses are that a signal-processing circuit comprising NMOS transistors (or bipolar transistors) can accept a high transmission rate or repetition frequency for the information-carrying signals and can provide, if required, an acceptable CM area, from somewhat below zero-potential to somewhat above half the supply voltage. Also, the signal-processing unit can adapt received signals to an internal signal structure, whether it is a CMOS signal or a bipolar ECL signal.

BRIEF DESCRIPTION OF THE DRAWINGS

Some basic circuits relevant to understanding the present invention and some circuits of known signal-receiving and signal-processing units and some of preferred embodiments of a signal-receiving and signal-processing unit in accordance with Applicant's invention will now be described in more detail with reference to the accompanying drawings, in which:

FIG. 3 illustrates a wiring diagram of a known signal-receiving and signal-processing unit having PMOS transistors in the signal-receiving circuit and post-connected current mirror circuits having two transistors;

FIG. 3a is an amplified view of the wiring diagram illustrated in FIG. 3 showing an amplifier having a PMOS transistor and a NMOS transistor and graph D illustrating the relation between in the input and output voltage.

DETAILED DESCRIPTION

Figure 1:
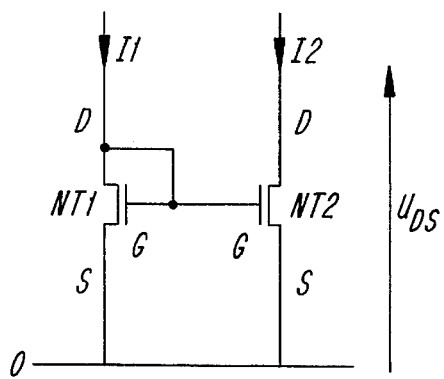
FIG. 1 illustrates a wiring diagram of a known current mirror circuit that is useful with Applicant's invention.
Figure 1A:
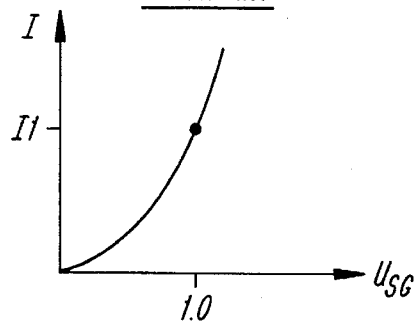
FIGS. 1A, 1B are graphs relating to the circuit in FIG. 1.
Figure 1B:
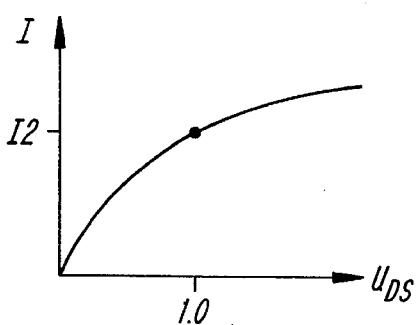

FIG. 1 illustrates a wiring diagram and FIGS. 1A, 1B are two graphs of a circuit used by the invention where the connection is done between two transistors in a way so that these serve as a current mirror circuit. It should be noticed that the current mirror circuit can be made of PMOS transistors and/or bipolar technology even though the embodiment is illustrated using NMOS transistors.

FIG. 1 illustrates two NMOS transistors NT1, NT2, where a controlling current I1 is supposed to pass through the transistor NT1 and a mirrored current I2 is supposed to pass through the transistor NT2. Each transistor has a source terminal S, a drain terminal D, and a gate terminal G.

The graph A in FIG. 1A is meant to illustrate the relationship between the current variations in the value of current I1 and the source-gate voltage. FIG. 1A shows that an increase of the current results in an increase of the voltage.

The graph B in FIG. 1B illustrates the variations of the drain-source voltage of the transistor NT2. FIG. 1B shows that the current variations of the current I2 will be very small in relation to the voltage variations $U_{DS}$ above a predetermined threshold voltage of about 1.0 volt (V).

A current generator of this kind should have a relatively high output impedance so that the current variations will be relatively small for changes of the voltage. Applicant's invention can use a known circuit, a so-called cascode circuit illustrated and described in FIG. 2, to eliminate this disadvantage.

Figure 2:
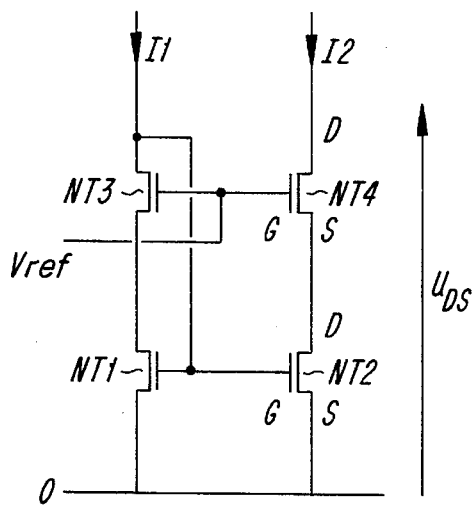
FIG. 2 illustrates a known cascode circuit having four transistors that is useful with the invention, whereby a current through a transistor will be more or less independent of the voltage across the terminals of the transistor.

FIG. 2 illustrates the use of two further NMOS transistors NT3, NT4, which results in the current variations in I2 being even less dependent on the drain-source voltage of the two transistors NT2, NT4 when the voltage is above a predetermined value. This is illustrated in the graph C shown in FIG. 2A. It can here be mentioned that the transistor NT4 is called the cascode transistor and the transistor NT2 is called the current transistor.

It should be clear that the current mirror circuit according to FIG. 1 very easily can be turned into a cascode circuit according to FIG. 2 for applications where a minor current variation (I2) appears because of large voltage variations ($U_{DS}$) across the cascode transistor NT4 and the current transistor NT2. The cascode circuit provides the current generator with a significantly higher output impedance. If two more transistors, besides the transistors NT3, NT4, form an additional "story", or layer, of cascode transistors, an even higher output impedance will result.

Figure 2A:
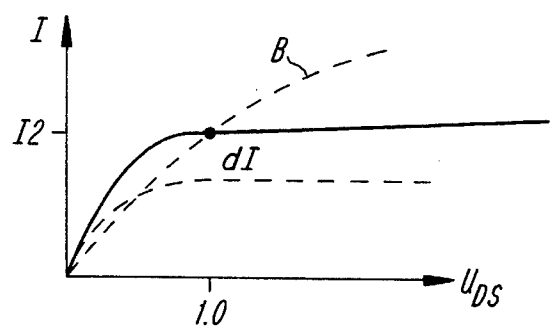
FIG. 2A is a graph relating to the circuit of FIG. 2.

FIG. 2A is intended to illustrate, with a continuous line and a dotted line, the current variation "dI" that is a result of a variation of I1 and where this variation is to be used in the accordance with Applicant's invention.

A wiring diagram of a signal-receiving and signal-processing unit 1 is illustrated in FIG. 3, where information-carrying signals in the form of differential voltage pulses appear on conductors L1, L2. The unit 1 comprises a signal-receiving circuit 2, including two PMOS transistors PT1 and PT2, and a post-connected signal-processing circuit 3. The information-carrying signals usually have a structure deviating from the internal signal structure. The signal-processing circuit 3 is intended to generate a pulsed voltage-related output signal on a conductor L3 that better agrees with the internal signal structure.

The circuit illustrated here includes a current generator S1 for supplying the circuit 2, and NMOS transistors NT5, NT6 for initial processing of the received voltage pulses. The transistors NT5, NT6 are adapted to the current variations (I1 and I2), where the transistor NT5 is current-mirror connected with an NMOS transistor NT10 for the current I1, and the transistor NT6 is current-mirror connected with an NMOS transistor NT9 for the current I2.

The current I2 is mirrored one further time by a further current mirror circuit comprising PMOS transistors PT7, PT8. The wiring diagram shown in FIG. 3 thus only includes current mirror circuits comprising two transistors according to FIG. 1.

An amplifier F1 amplifies a voltage originating from the momentary current differences I1–I2 so that an increasing voltage on the input of the amplifier results in a decreasing voltage on the amplifier output L3. The amplifier F1, illustrated in FIG. 3a, comprises two transistors, a PMOS transistor PT11 and an NMOS transistor NT12, in a previously known way. The relation between the input voltage and the output voltage can change momentarily with the dimensioning of the transistors PT11, NT12 according to the illustrated graph D, and this signal is CMOS-adapted.

The circuit illustrated in FIG. 3 can be supposed to have a CM area between zero and up to half the supply voltage (Vcc), and can receive and detect signal pulses on the conductors L1, L2 having a high repetition frequency, say, up to 100 MHz.

Figure 4:
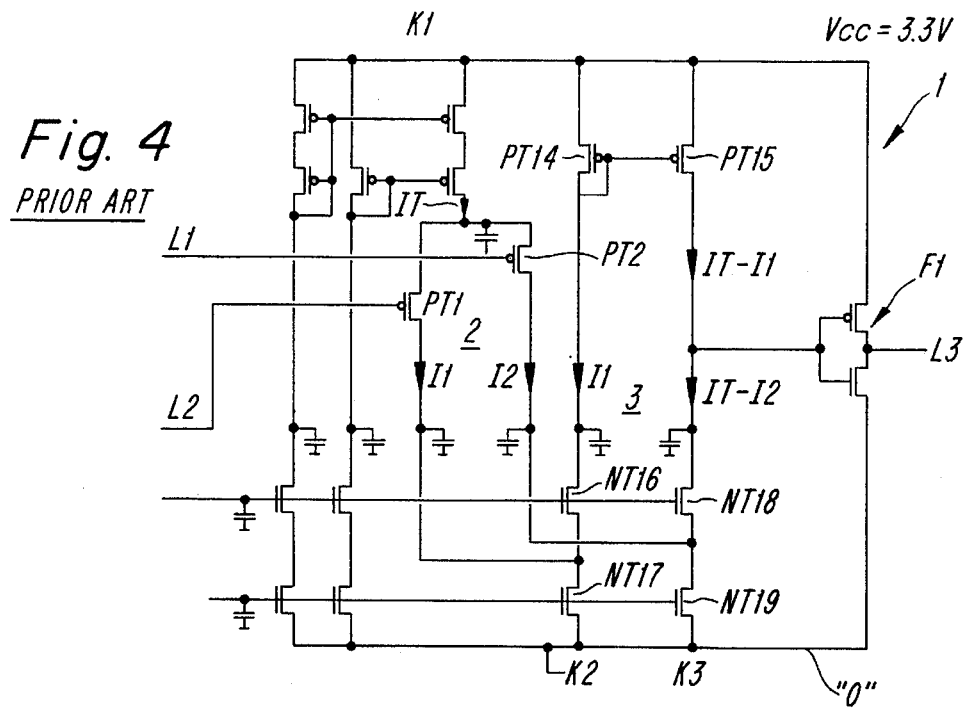
FIG. 4 illustrates a wiring diagram of a known signal-receiving and signal-processing unit having PMOS transistors in the signal-receiving circuit and post-connected cascode circuits having four transistors.

FIG. 4 shows an alternative signal-receiving and signal-processing unit 1 having a signal-receiving circuit 2 and a signal-processing circuit 3 where the latter comprises two current mirror circuits in the form of two cascode circuits K2, K3 and another current mirror circuit comprising PMOS transistors PT14, PT15. In FIG. 4, the signal-receiving circuit 2 uses the PMOS transistors PT1, PT2 connected in the same way as in FIG. 3, one for each conductor L1, L2.

The construction illustrated in FIG. 4 uses a further cascode circuit K1 made of PMOS transistors to supply the transistors PT1, PT2 with the sum current IT=I1+I2 (which later appear to the amplifier F1 as current differences), in the same way as illustrated in FIG. 3. The current I1 is connected to the cascode circuit K2 through the cascode transistor NT16 and the current transistor NT17, while the current I2 is connected to the cascode circuit K3 through the cascode transistor NT18 and the current transistor NT19. (Only half the cascode circuit is illustrated here.) Only the current I1 is mirrored through the illustrated mirror circuit comprising the transistors PT14, PT15.

With differential signal transmission and with this circuit, the CM area can include the area from somewhat below zero level, say –0.7 V, up to somewhat more than half the supply voltage Vcc. The circuit can receive and detect signal pulses having a repetition frequency of up to approximately 100 MHz.

Figure 5A:
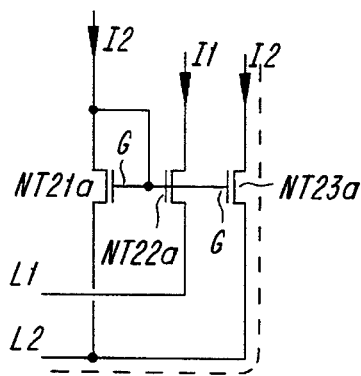
FIG. 5a illustrates an alternative (simplified) signal-receiving circuit according to FIG. 5 for single-ended signal transmission.
Figure 5:
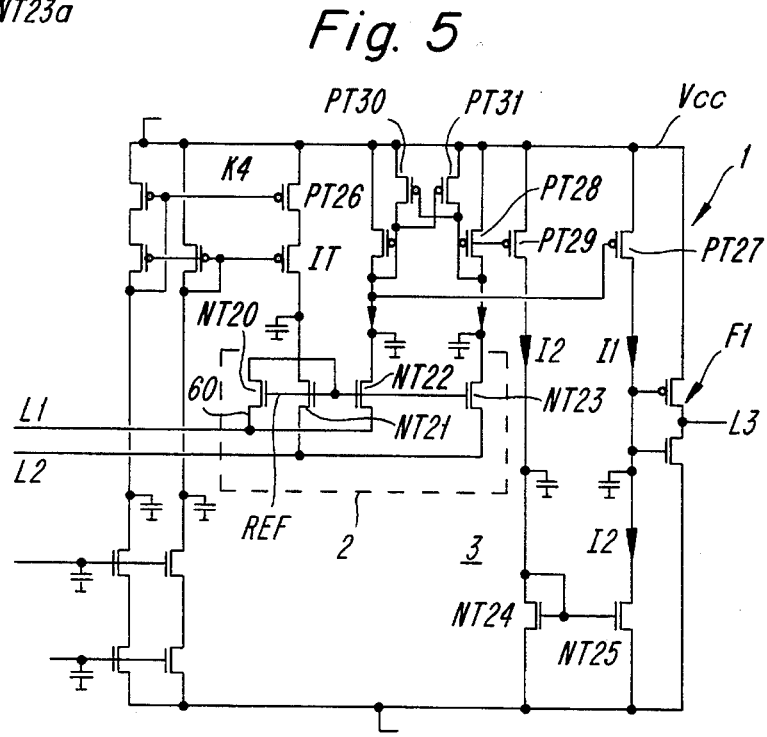
FIG. 5 illustrates a signal-receiving and signal-processing unit for differential signal transmission having NMOS transistors in the signal-receiving unit connected to the two conductors for the information-carrying signals.

FIG. 5 shows a wiring diagram of a signal-receiving and signal-processing unit 1 according to Applicant's invention, where the signal-receiving circuit 2 comprises four NMOS transistors, NT20, NT21, NT22, NT23 intended for a pronounced differential signal transmission. The transistors NT20, NT21 are supplied with a current through a current originating from the cascode circuit K4 comprising PMOS transistors to generate a total current IT from the sum of the currents I1, I2 that pass through the transistors NT20, NT21. The current I1 is supposed to pass through the transistor NT20 and the current I2 is supposed to pass through the transistor NT21 in dependence on the momentary voltage differences appearing on the conductors L1, L2. The relation between I1+I2 and IT is always constant.

The voltages on the conductors L1, L2 are normally distributed in a way such that either the current I1 or the current I2 passes, and only during the switching time does a current pass through both transistors NT20, NT21. As voltage pulses appear on the conductors L1, L2, the momentary voltage relation that is received by the signal-receiving circuit 2, that is detected by its transistors NT20, NT21, and that generates the corresponding changes in the momentary currents I1, I2 changes.

FIG. 5 is intended to illustrate that, in accordance with the invention, the current I1 is current-mirror connected through the transistor NT22 and the current I2 is current-mirror connected through the transistor NT23. The wiring diagram illustrates that the current I1 is mirrored in a further current mirror circuit made of transistors PT26, PT27 before I1 has an effect on the amplifier F1. The current I2 is mirrored both in a current mirror circuit made of transistors PT28, PT29 and in a current mirror circuit made of transistors NT24, NT25 before it has an effect on the amplifier F1. The momentary current difference I1–I2 affects the momentary voltage on the input terminal of the amplifier F1 in the same way as described with reference to FIG. 3.

With differential signal transmission, this circuit provides a CM area corresponding to that which is specified in FIG. 4, and the limit value of the repetition frequency has increased to the Gb/s or GHz range to the use of NMOS transistors and current mirror circuits at least in the signal-receiving circuit 2. It should be noticed that NMOS transistors are used in the upper part of the illustrated wiring diagram and NMOS transistors in the lower part.

It can, in conclusion, be said that the use of transistors with a short reaction time, such as NMOS transistors, in the receiver circuit 2 is required to be able to detect the transition between one information-carrying digital voltage pulse and another, but it is not required to have such fast circuits for the following signal processing, once that transition is detected.

Differential signal transmission illustrated in FIG. 5 can be further transformed in a simple way into single-ended transmission by locking the potential of conductor L2 voltage-wise or by using the simplified wiring diagram shown in FIG. 5a.

The embodiment illustrated in FIG. 5 indicates that a first transistor NT20 is connected to a first conductor L1 and that a second transistor NT21 is connected to a second conductor L2. It is further indicated that two transistors NT20, NT22 and two transistors NT21, NT23, or several transistors, are respectively connected to one and the same conductor L1, L2. It is hereby meant that one transistor, such as NT20, can comprise one transistor or several transistors connected in parallel and that the two or more transistors belonging to a current mirror circuit can in this regard differ from one another. The transistor NT23 could thus comprise two or several parallel-connected transistors, while the transistor NT21 could comprise a single transistor whereby an amplifier circuit is inserted in between them. This permits "scaling" the current relations between the total current IT and the sum of the currents I1 and I2 and in this manner saving power.

FIG. 5 illustrates further that the pair-wise transistors NT20, NT22 and NT21, NT23 for the conductors L1, L2, respectively, are connected to each other as a current mirror circuit each. The thereby appearing and received current difference in the signal-processing circuit 3 can be fed out as a pulsed voltage-related output signal on the conductor L3, having an internal selected signal structure. The pair-wise transistors NT20, NT22 and NT21, NT23 from the respective conductors L1, L2, can be regarded as serving as double floating current mirror circuits. The terminal 60 may be either the drain or source depending on the orientation of the transistors.

There is nothing to prevent each and every one of the current mirror circuits, such as the transistors NT24, NT25, PT28, PT29 and the transistors PT26, PT27, from creating the conditions for a cascode circuit or the like and thereby further improving the internal signal structure of the output signal appearing on conductor L3.

In the above-described embodiments, the current I1 is permitted to be activated by one current mirror circuit (transistors PT26, PT27) while the current I2 is permitted to be activated by two current mirror circuits (transistors PT28, PT29 and transistors NT24, NT25). In principle, this will produce a time delay of the current pulses from I2 to the amplifier F1 and a distortion of the switching time for the amplified and inverted signal on conductor L3. This distortion can be compensated by giving the two transistors PT11, NT12 different sizes, thereby changing the switching level of the amplifier F1.

The PMOS transistors PT30, PT31 illustrated in FIG. 5 are connected to shorten the switching time as the two currents I1, I2 are switched. The two feedback-connected transistors present two loads with a negative impedance, which in turn helps to speed up the switching time.

Figure 6:
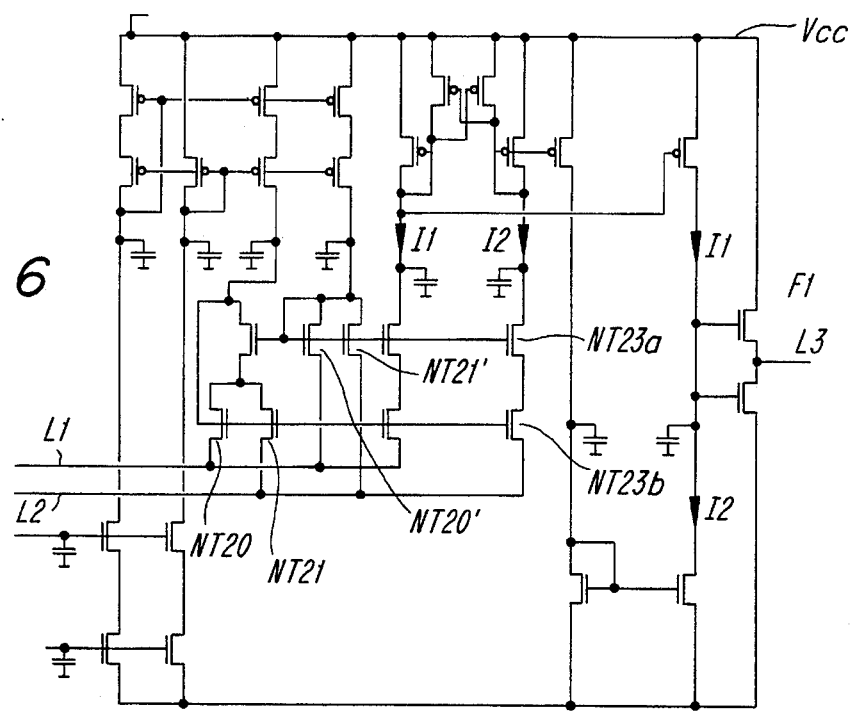
FIG. 6 illustrates an alternative embodiment of a signal-receiving and signal-processing unit for differential signal transmission according to FIG. 5.

An alternative embodiment to the circuit illustrated in FIG. 5 is illustrated in FIG. 6, which shows the transistors NT20, NT20' mutually connected to the conductor L1 and the transistors NT21, NT21' mutually connected to the conductor L2.

Also, a cascode circuit is provided at the input stage (transistors NT20–NT23) that improves the input CM characteristics. This makes the currents I1, I2 less dependent on the CM voltage of the input, which in turn reduces the time variations in the signal-processing stage since the sum of the currents is constant. The transistors NT20', NT21' are for generating the required voltage reference (Vref) for the cascode circuit.

The voltage difference between the conductors L1, L2 is detected by the transistors NT20, NT21 and provides thereby the required voltage reference for the current transistors in the cascode circuit (one of them being illustrated as transistor NT23b). The voltage difference between the conductors L1, L2 is also detected by the transistors NT20', NT21' and has thereby an effect on the cascode transistors in the cascode circuit (one of them being illustrated as transistor NT23a).

Figure 7:
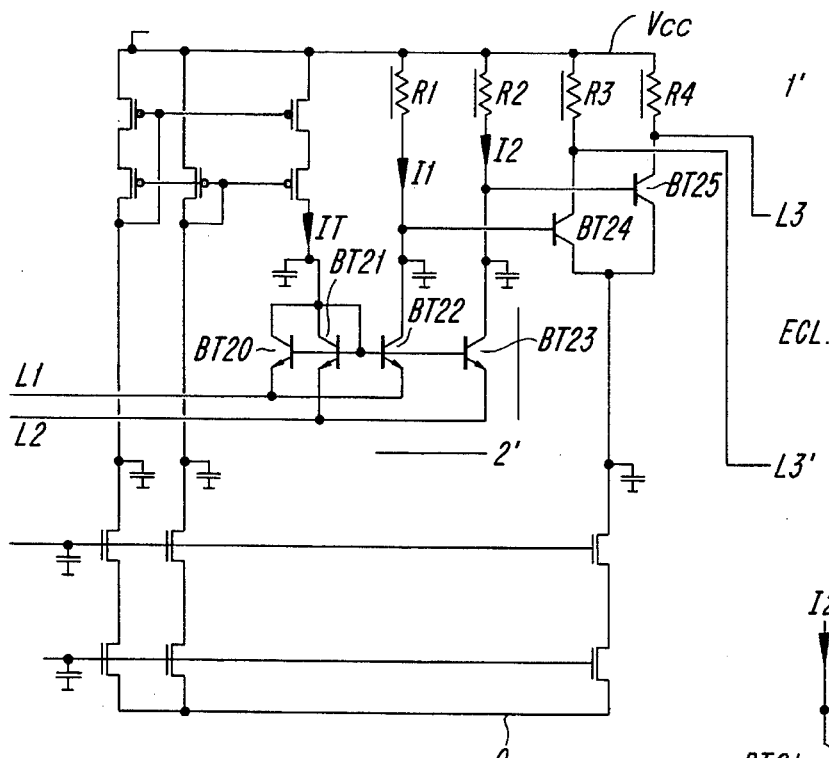
FIG. 7 illustrates a signal-receiving and signal-processing unit for differential signal transmission and mainly constructed out of bipolar transistors connected to the two conductors for the information-carrying signals.

In FIG. 7, a signal-receiving and signal-processing unit 1' is illustrated in which a signal-receiving circuit 2' comprises bipolar transistors that are mainly connected in the way indicated by the wiring diagram in FIG. 5, but where transistors, such as transistors BT20, BT21, are connected to respective ones of the conductors L1, L2 by their respective emitter terminals. The transistors BT20–BT23 correspond to the transistors NT20–NT23 in FIG. 5 and are connected in the same way. The embodiment at large, according to FIGS. 5 and 6, can be applied to FIG. 7.

The now illustrated embodiments have been described with the understanding that the voltage-related signals appearing on the conductors L1, L2 are to be evaluated as voltage differences and converted into current differences (I1–I2). The above-described circuits will work in the same way for single-ended signalling, with the difference that one conductor (for instance, the conductor L2) is given a constant reference potential (see FIGS. 7a and 9).

Figure 7A:
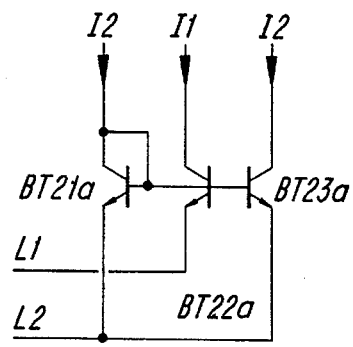
FIG. 7a illustrates an alternative (simplified) signal-receiving circuit according to FIG. 7 for single-ended signal transmission.

FIG. 7a (and FIG. 5a) illustrates a simplified single-ended circuit for single-ended signalling on the conductor L1, with the transistors BT21a, BT23a forming a current mirror circuit for keeping the current I2 constant and the transistor BT22a generating the current variations in the current I1 corresponding to the voltage variations on the conductor L1.

In general it can be said that, if NMOS transistors are used, the source terminal is to be connected to the conductor L1 or L2 having the lower potential level and the drain terminal is to be connected to the higher potential. A CMOS transistor is normally, physically speaking, totally symmetrical, and thus the question of drain or source terminal is more a matter of definition.

It is specifically indicated (in FIG. 5) that the transistors NT22, NT23 in any case can be doubled, or even consist of more transistors, to thereby create a changed and selected amplification of the reference current IT with the purpose of saving the total current consumption, which in the dimensioning instructions also can be relevant for other illustrated transistor circuits.

Figure 8:
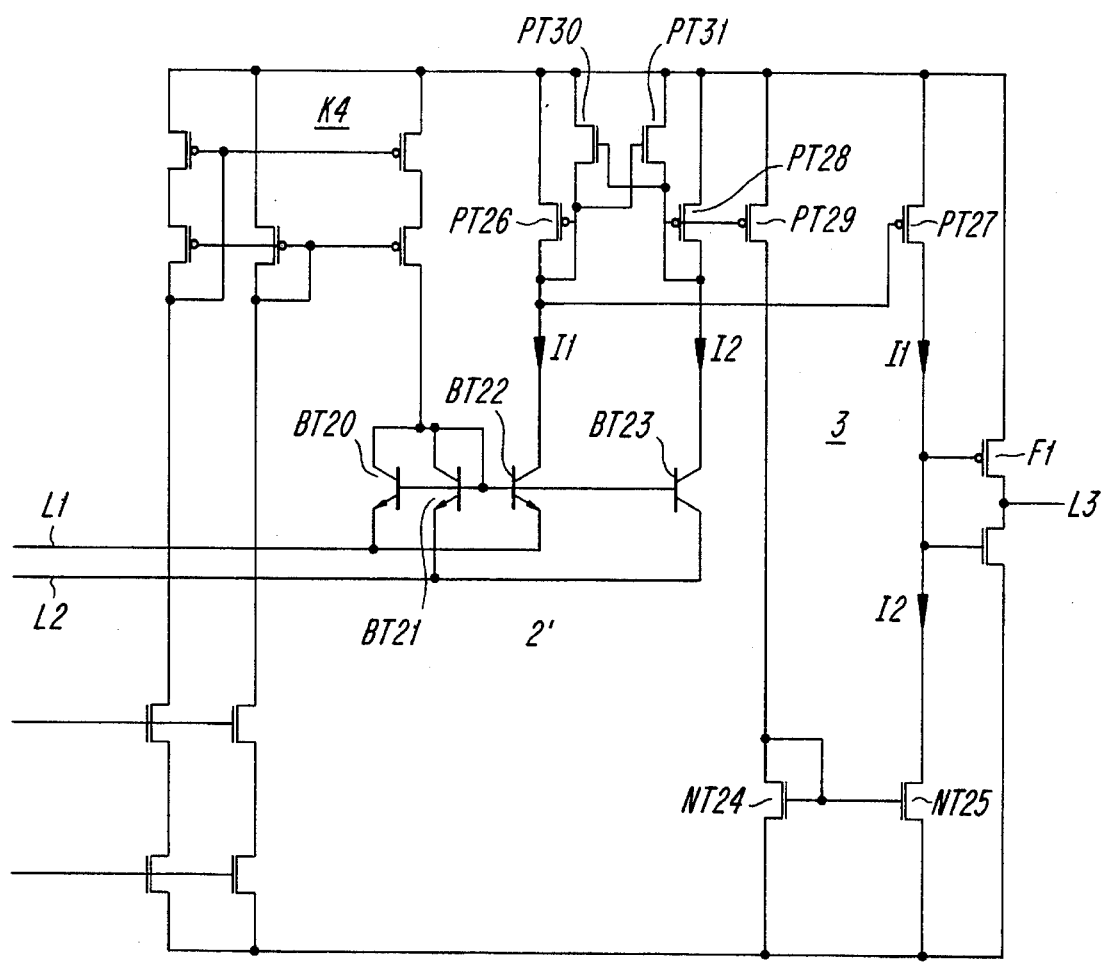
FIG. 8 illustrates a wiring diagram with bipolar transistors in the signal-receiving circuit and PMOS transistors in the signal-processing circuit to generate a CMOS-adapted signal according to FIG. 5.

FIG. 8 illustrates a wiring diagram with bipolar transistors BT20, BT21, BT22, BT23 being a part of the signal-receiving circuit 2' and with the signal-processing circuit 3 comprising some NMOS transistors and several PMOS transistors for generating a CMOS-adapted output signal on the conductor L3. The PMOS and NMOS transistors in the current mirror circuits (PT26, PT27, PT28, PT29 and NT24, NT25) are also seen in FIG. 5.

Variations in the currents I1, I2 will, as described with reference to FIG. 7, generate a voltage difference across the resistances R1, R2 that will be amplified by the post-connected differential stage BT24, BT25, which in turn will provide a voltage drop across the resistances R3, R4. The voltage differences across the resistances R3, R4 form ECL signals on the highest level. If it is desired to shift the level of the ECL signals down, this can be achieved with post-connected emitter followers in a known way.

The transistors BT22, BT23 can each be made of several parallel-connected transistors, as the respective NMOS transistors NT22, NT23, for amplifying the reference current IT. It is further within the scope of Applicant's invention to divide one or several of the transistors into parallel-connected smaller transistors in a known way, thereby increasing the accuracy.

The bandwidth or highest rate in the signal-receiving circuit 2 and/or the signal-processing circuit 3 can be increased by increasing the reference current IT. The bandwidth can be selected to correspond to a selected reference current, and the reference current can be decreased at lower transmission rates with the result that power consumption is decreased.

Figure 9:
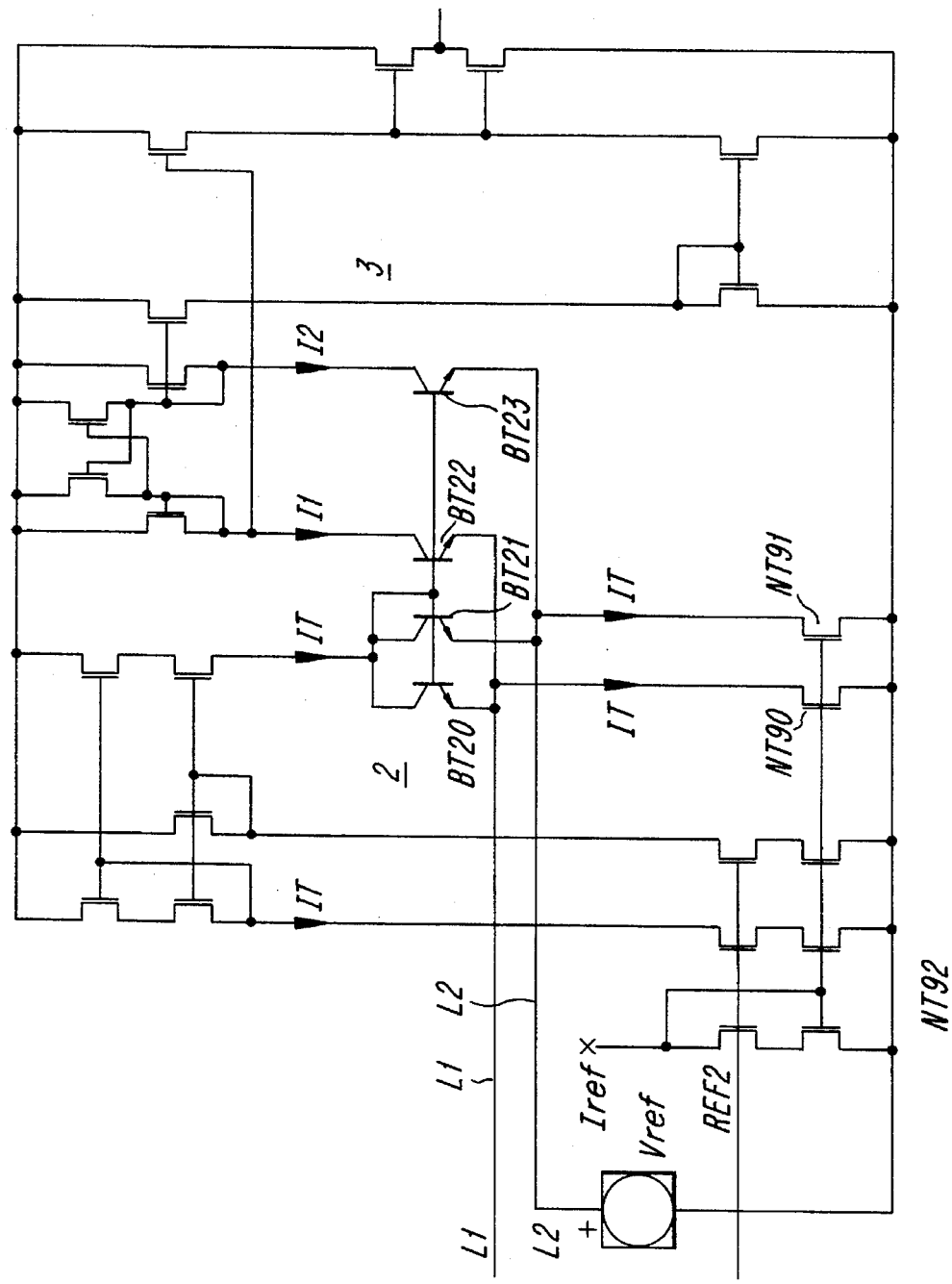
FIG. 9 illustrates a compensation circuit for single-ended signalling.

FIG. 9 illustrates a wiring diagram of a compensating circuit that is specifically adapted to single-ended signalling and that has a reference voltage connected to the conductor L2. The illustrated compensating circuit is a complement to the embodiment shown in FIG. 8, but it can also be useful with the embodiments illustrated in FIGS. 5, 6, and 7.

Through two NMOS transistors NT90, NT91, each connected to a respective one of the conductors L1, L2, the gate terminals are mutually connected and controlled by a reference current Iref, which is a current that will represent the total current IT. The compensating current IT, passing through both transistors NT90, NT91, stands in proportion to Iref and thereby also to the current IT+I1+I2 passing through the transistors BT20–BT23 in the signal-receiving circuit 2. These currents will even each other out, whereby no current will appear in the conductors L1, L2 when these are in balance.

It will be understood that Applicant's invention is not restricted to the aforesaid and the illustrated exemplifying embodiments thereof and that modifications can be made within the scope of the following claims.

What is claimed is:

1. A signal receiving and processing unit connected to at least one conductor for transmitting information carrying signals as voltage pulses comprising:

a signal receiving circuit including a first transistor, directly connected to the conductor, for affecting a current according to variations in the voltage pulses and a voltage value of a voltage pulse, wherein the current is in a form of pulses that pass through the transistor and is generated by the voltage pulse variations and voltage level;

a signal processing circuit for processing the affected current according to a signal information carrying form; and a floating current mirror circuit including at least a second transistor coordinated with the first transistor.

2. The unit of claim 1, wherein the unit is configured for single-ended signalling, the transistor in the signal-receiving circuit is an NMOS transistor and is connected to receive voltage pluses appearing on the conductor, and an additional NMOS transistor is connected to the at least second transistor, which is also an NMOS transistor, for forming a current mirror circuit.

3. The unit of claim 2, wherein the two connected NMOS transistors are connected to the conductor by their source terminals.

4. The unit of claim 2, wherein the two connected NMOS transistors are connected to the conductor by their drain terminals.

5. The unit of claim 2, wherein the two connected NMOS transistors are connected to each other and to a reference potential by their gate terminals.

6. The unit of claim 2, wherein the NMOS transistors are supplied with a current by at least one current mirror circuit.

7. The unit of claim 2, wherein a first current driven through a first one of the NMOS transistors is transferred through a first number of current mirror circuits for mirroring a selected number of times (n) and a second current driven through a second one of the NMOS transistors is transferred through a second number of current mirror circuits for mirroring another selected number of times (n+1).

8. The unit of claim 2, wherein a difference between momentary values of the first and second currents is connected to a signal amplifier comprising one NMOS transistor and one PMOS transistor connected to each other in series, the NMOS and PMOS transistors in the signal amplifier have different characteristics, and the characteristics are selected so that the transistors compensate time deviations due to a difference between the first and second numbers of current mirror circuits.

9. The unit of claim 2, wherein two NMOS transistors are connected to a second conductor and connected to each other for forming a current mirror circuit in order to generate a constant current value, and one NMOS transistor associated with a first conductor is arranged to vary its current value depending on at least one of the voltage pulses and the variations that appear on the first conductor.

10. The unit of claim 1, wherein the signal receiving circuit including one NMOS transistor is connect to a first conductor and two NMOS transistors, which form a mirror circuit, are connected to a second conductor.

11. The unit of claim 10, wherein two NMOS transistors are connected in parallel to the first conductor.

12. The unit of claim 10, wherein at least two pairs of NMOS transistors, each pair coordinated into current mirror circuits, are connected to the second conductor.

13. The unit of claim 10, wherein a source terminal of a respective NMOS transistor is connected to the first conductor.

14. The unit of claim 10, wherein a drain terminal of a respective NMOS transistor is connected to the first conductor.

15. The unit of claim 1, wherein the unit is configured for differential signalling via first and second conductors, wherein each conductor transmits information-carrying signals as voltage pulses, and each conductor is connected to a respective transistor in the signal-receiving circuit for affecting a respective current passing through the respective transistor according to variations in the voltage pulses and the voltage value of a pulse, where each respective current is formed of pulses and is generated by respective voltage pulse variations and voltage level, and the transistors are NMOS transistors connected for receiving voltage pulses appearing on the respective conductors; and each transistor is connected to another NMOS transistor for forming a current mirror circuit.

16. The unit of claim 15, wherein the NMOS transistors are connected to the first and second conductors by their source terminals.

17. The unit of claim 15, wherein the NMOS transistors are connected to the first and second conductors by their drain terminals.

18. The unit of claim 15, wherein the NMOS transistors are connected to each other and to a reference potential by their gate terminals.

19. The unit of claim 15, wherein the NMOS transistors are supplied with a current by at least one current mirror circuit.

20. The unit of claim 15, wherein a first current driven through one set of two NMOS transistors forming a current mirror circuit is transferred through a first number of current mirror circuits for mirroring a selected number of times (n), and a second current driven through another set of two NMOS transistors forming a current mirror circuit is transferred through a second number of current mirror circuits for mirroring another selected number of times (n+1) to a signal amplifier.

21. The unit of claim 20, wherein a difference between momentary values of the first and second currents is connected to the signal amplifier, the signal amplifier comprises an NMOS transistor and a PMOS transistor connected to each other in series, the NMOS and PMOS transistors in the signal amplifier have different characteristics, and the characteristics are selected so that the transistors compensate time deviations due to a difference between the first and second numbers of current mirror circuits.

22. The unit of claim 15, wherein two NMOS transistors are connected to the first conductor, and two NMOS transistors forming a current mirror circuit are connected to the second conductor.

23. The unit of claim 22, wherein at least two pairs of NMOS transistors, each pair forming a current mirror circuit, are connected to the second conductor.

24. The unit of claim 22, wherein a source terminal of an NMOS transistor is connected to the first conductor.

25. The unit of claim 22, wherein a drain terminal of an NMOS transistor is connected to the first conductor.

26. The unit of claim 15, wherein at least two pairs of NMOS transistors are connected in parallel to the first conductor.

27. The unit of claim 15, wherein two NMOS transistors associated with the second conductor are connected to the second conductor and to each other for forming a current mirror circuit in order to generate a variable current value, and two NMOS transistors associated with the first conductor are arranged to generate a variable current value depending on voltage pulses that appear on the first conductor.

28. The unit of claim 27, wherein pairs of NMOS transistors associated with the first and second conductors are connected as current mirror circuits, and a current difference received by the signal-processing circuit is fed out as a pulsed output signal.

29. The unit of claim 28, wherein one pair of the NMOS transistors associated with each of the first and second conductors serves as a double floating current mirror circuit.

30. The unit of claim 15, wherein both NMOS transistors in the pair of NMOS transistors associated with one of the first and second conductors are supplied with a current by a cascode circuit.

31. The unit of claim 30, wherein both NMOS transistors in the pair of NMOS transistors associated with the other one of the first and second conductors are post-connected, one with an even number and one with an odd number, to current mirror circuits in the signal-processing circuit.

32. The unit of claim 31, wherein means, in the signal-processing unit, for evaluating current differences is post-connected by an inverter for generating an output signal.

33. The unit of claim 15, wherein the current mirror circuit is a cascode circuit.

34. The unit of claim 1, wherein the unit is configured for single-ended signalling via a conductor to transmit information-carrying signals as voltage pulses, the transistor in the signal-receiving circuit is a bipolar transistor connected to receive voltage pulses appearing on the conductor, and an additional bipolar transistor is connected to another bipolar transistor for forming a current mirror circuit.

35. The unit of claim 34, wherein the two connected bipolar transistors are connected to the conductor by their emitter terminals.

36. The unit of claim 34, wherein the two connected bipolar transistors are connected to each other and to a reference potential by their base terminals.

37. The unit of claim 34, wherein the two bipolar transistors are supplied with a current by at least one current mirror circuit.

38. The unit of claim 34, wherein a first current driven through one of the two bipolar transistors is transferred through a first number of current mirror circuits for mirroring a selected number of times (n) and a second current driven through the other one of the two bipolar transistors is transferred through a second number of current mirror circuits for mirroring another selected number of times (n+1).

39. The unit of claim 34, wherein a difference between momentary values of the first and second currents is connected to a signal amplifier.

40. The unit of claim 34, wherein bipolar transistors in the signal-receiving circuit have their base terminals connected to a reference potential, and remaining current mirror circuits are made of at least one of PMOS transistors and NMOS transistors.

41. The unit of claim 34, wherein current variations are connected to a differential amplifier for converting a voltage difference over a resistor to an ECL signal.

42. The unit of claim 1, wherein the signal receiving circuit including one bipolar transistor is connected to a first conductor, and two bipolar transistors forming a current mirror circuit are connected to a second conductor.

43. The unit of claim 42, wherein at least two bipolar transistors are, in parallel, connected to the first conductor.

44. The unit of claim 42, wherein at least two pairs of bipolar transistors, each pair being coordinated into a current mirror circuit, are connected to the second conductor.

45. The unit of claim 42, wherein an emitter terminal of a bipolar transistor is connected to the first conductor.

46. The unit of claim 45, wherein two bipolar transistors are connected to the second conductor and to each other for forming a current mirror circuit for generating a constant current, and one bipolar transistor associated with the first conductor varies its current depending on one of the voltage pulses and variations that appear on the first conductor.

47. The unit of claim 1, wherein the unit is configured for differential signalling via first and second conductors, wherein each conductor transmits information-carrying signals as voltage pulses, and each conductor is connected to a respective bipolar transistor in the signal-receiving circuit for affecting a respective current flowing through the transistor according to variations in the voltage pulses and the voltage value of a pulse, where each respective current is formed of pulses and is generated by respective voltage pulse variations and voltage level, each respective current is given a signal-adapted information-carrying form by the signal-processing circuit, and the transistors are bipolar transistors connected for receiving voltage pulses appearing on the respective conductor; and each transistor is connected to another bipolar transistor for forming a current mirror circuit.

48. The unit of claim 47, wherein the bipolar transistors are connected to the first and second conductors by their emitter terminals.

49. The unit of claim 47, wherein the bipolar transistors are connected to each other and to a reference potential by their base terminals.

50. The unit of claim 47, wherein the bipolar transistors are supplied with current by at least one current mirror circuit.

51. The unit of claim 47, wherein a difference between momentary values of the respective currents are connected to a signal amplifier.

52. The unit of claim 47, wherein two bipolar transistors are connected to the first conductor and two bipolar transistors, which form a mirror circuit, are connected to the second conductor.

53. The unit of claim 52, wherein at least two pairs of bipolar transistors, each pair being coordinated into a current mirror circuit, are connected to the second conductor.

54. The unit of claim 52, wherein an emitter terminal of a bipolar transistor is connected to the first conductor.

55. The unit of claim 47, wherein at least two pairs of bipolar transistors are, in parallel, connected to the first conductor.

56. The unit of claim 47, wherein two bipolar transistors are connected to the second conductor and to each other for forming a current mirror circuit for generating a variable current, and two bipolar transistors associated with the first conductor generate a variable current which depends on the voltage-pulses appearing on the first conductor.

57. The unit of claim 56, wherein one pair of bipolar transistors from each of the first and second conductors is connected as a current mirror circuit, and a current difference received by the signal-processing circuit is fed out as a pulsed ECL output signal.

58. The unit of claim 57, wherein one pair of the pair-wise related bipolar transistors associated with each of the respective two conductors serves as a double floating current mirror circuit.

59. The unit of claim 47, wherein every one of one of the pair-wise related bipolar transistors are supplied with a current by a cascode circuit.

60. The unit of claim 47, wherein the current mirror circuit is a cascode circuit.

61. The unit of claim 1, wherein a number of transistors are coordinated to shorten a switching time between received current pulses.

62. The unit of claim 1, wherein PMOS transistors are used in a current supply through a current mirror circuit.

63. The unit of claim 1, wherein at least one transistor comprises at least two parallel-connected transistors.

64. The unit of claim 1, wherein a selected bandwidth corresponds to a selected value of a reference current.

65. The unit of claim 1, wherein the transistor is connected to the conductor for controlling a reference current such that no current passes when the conductor is balanced with respect to another conductor to which another transistor is connected.

66. The unit of claim 65, wherein a compensating current through the transistors corresponds to a selected reference current.

67. The unit of claim 66, wherein one of the gate and base terminals are coordinated to a reference potential.

68. The unit of claim 65, wherein the compensating current corresponds to a current that passes through transistors in the signal-receiving circuit.

69. The unit of claim 65, wherein the transistors are NMOS transistors.

70. The unit of claim 65, wherein the transistors are coordinated to a reference potential formed by a cascade transistor.

* * * * *